United States Patent [19]

Sarwinski et al.

[11] Patent Number: 4,680,936
[45] Date of Patent: Jul. 21, 1987

[54] CRYOGENIC MAGNET SYSTEMS

[75] Inventors: Raymond E. Sarwinski; John R. Purcell, both of San Diego; Judson W. Parker, Escondido; Sibley C. Burnett, San Diego, all of Calif.

[73] Assignee: GA Technologies Inc., San Diego, Calif.

[21] Appl. No.: 813,175

[22] Filed: Dec. 24, 1985

[51] Int. Cl.⁴ .............................................. F25B 19/00
[52] U.S. Cl. .......................................... 62/45; 62/119; 62/514 R
[58] Field of Search ...................... 62/45, 514 R, 119

[56] References Cited

U.S. PATENT DOCUMENTS

| | | | |
|---|---|---|---|
| 3,129,334 | 4/1964 | Loflin et al. | 62/119 |
| 3,860,494 | 1/1975 | Hickman | 165/104.24 |
| 3,894,403 | 7/1975 | Longsworth | 62/55 |
| 3,930,375 | 1/1976 | Hofmann | 62/45 |
| 4,057,963 | 11/1977 | Basiulis | 165/104.24 |
| 4,223,540 | 9/1980 | Longsworth | 62/514 |
| 4,277,949 | 7/1981 | Longsworth | 62/54 |
| 4,386,309 | 5/1983 | Peschka | 62/45 |
| 4,537,033 | 8/1985 | Kamil | 62/3 |

Primary Examiner—Ronald C. Capossela
Attorney, Agent, or Firm—Fitch, Even, Tabin & Flannery

[57] ABSTRACT

According to the present invention, improved cryogenic magnet systems for use in MRI devices are provided. These systems comprise an electromagnet immersed in a first tank containing a first liquefied gas. The first tank is located in an evacuated container that is evacuated to a high vacuum. A refrigerating system external to said evacuated container includes a second gas and a means for liquefying said second gas. A heat radiation shield means surrounding said first tank is cooled by the liquified second gas. Features of the invention include a thermal siphon for cooling the heat radiation shield and neon as the second gas.

2 Claims, 4 Drawing Figures

CRYOGENIC MAGNET SYSTEMS

This invention relates to magnetic resonance imaging (MRI) devices and more particularly to cryogenic magnet systems for use in such devices.

BACKGROUND OF THE INVENTION

Cryogenic magnet systems are used in many of the presently available and proposed MRI devices. Liquid helium is used to cool the electromagnets to the low superconducting temperature required. One of the problems with liquid helium cooled systems is that low temperature is maintained by the "Boil Off" of the liquid helium that occurs when its temperature reaches 4.2° Kelvin (at atmospheric pressure). Due to the "Boil Off" the helium has to be replaced periodically.

To reduce the boil off of expensive helium, MRI magnet systems typically contain a heat radiation shielding means which itself is usually cooled by a nitrogen system. In most cases the nitrogen, like the helium, is supplied in bottles and is boiled off in the process of cooling the shield. The problem to be solved by this invention is to reduce the cost and effort associated with cooling the shield.

SUMMARY OF THE INVENTION

Figure 1:
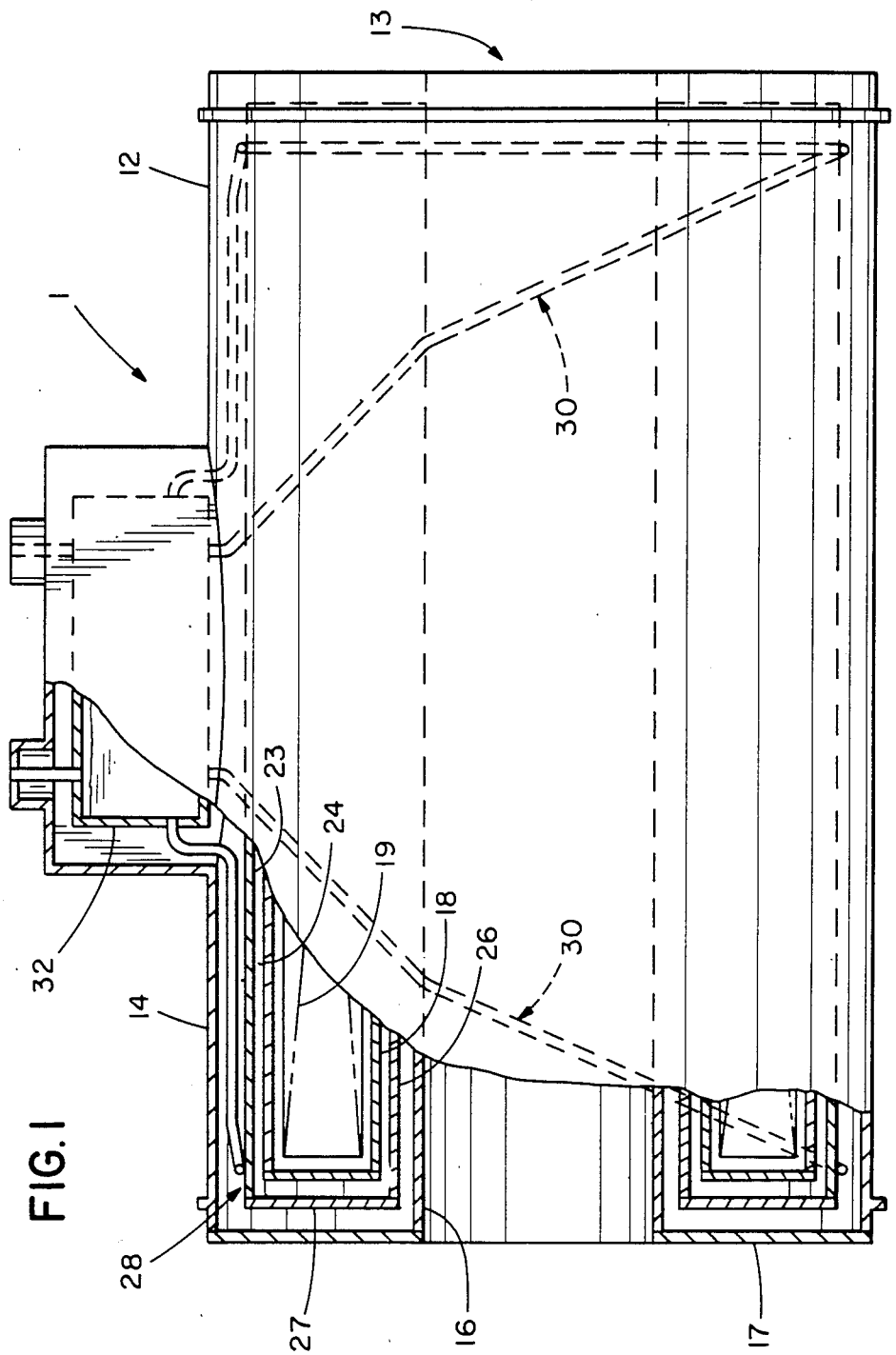
FIG. 1 is a "breakaway" side view of a magnet assembly showing some of the major component parts of one embodiment of the present invention.

According to the present invention, improved cryogenic magnet systems for use in MRI devices are provided. These systems comprise an electromagnet immersed in a first tank containing a first liquefied gas. The first tank is located in an evacuated container that is evacuated to a high vacuum. A refrigerating system external to said evacuated container includes a second gas and a means for liquefying said second gas. A heat radiation shield means surrounding said first tank is cooled by the liquefied second gas. Features of the invention include a thermal siphon for cooling the heat radiation shield and neon as the second gas.

The invention enables improved cryogenic magnet systems that avoid the time consuming and expensive replacement of nitrogen and reduces the helium usage compared to that experienced with prior art systems.

DETAILED DESCRIPTION OF PREFERRED EMBODIMENT

A preferred embodiment of the present invention can be described by reference to the figures.

The improved cryogenic magnet system comprises a magnet assembly 1 comprising an outer shell 12 that approximates a hollow cylinder. The bore or cylindrical volume 13 between the dashed lines is hollow. The patient or subject is placed into this space to obtain the MRI images. Thus, the outer shell 12 encompasses two cylindrical room temperature bore tubes 14 and 16. The tubes are joined by means such as end spinning 17.

A first hollow cylindrical tank 18 is substantially filled with a first liquid gas. Helium is the preferred gas for this tank. The tank also contains the superconducting electromagnet, indicated generally at 19.

The superconducting magnet 19 comprises a coil made of windings of superconducting wire which at low temperature, as is well known, reduces has zero resistance in. Once the coil is energized to a desired magnetic field, a superconducting short circuiting switch is closed, the power is turned off and the electromagnet maintains its magnetism practically indefinitely.

The magnet 19 is kept at superconducting temperature by the boiling off of liquid helium in the tank 18, as is common practice in the art. The liquid helium fill lines and helium exhaust lines are not shown, as the placement of these lines is well known by persons skilled in the art.

The helium tank 18 is surrounded by a vacuum since it is located in a vacuum chamber defined by the room temperature bore tubes 14 and 16 and the spinnings 17. Radiation shield tubes 23 and 26 and a radiation shield end plate 27 form thermal shield tank 28 and a heat shielded chamber 24 for the helium tank.

Figure 2:
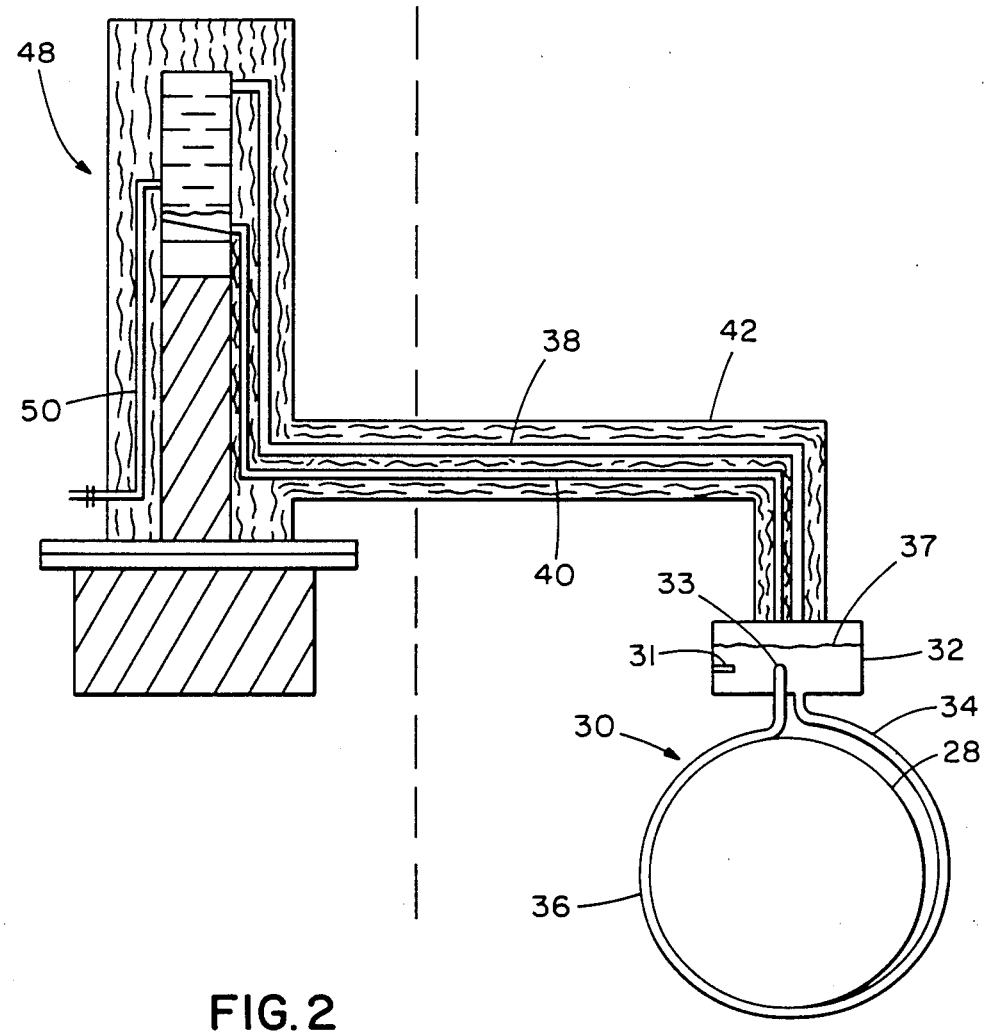
FIG. 2 is a schematic view showing some of the features of one embodiment of the invention.

The cooling of the radiation shield is accomplished not only by boiling off of the liquid helium, but also by a thermal siphon 30 as shown in FIG. 2. The thermal siphon 30 is comprised of ballast tank 32 disposed above the heat shield 28 to which it is coupled by a down leg 34 and an up leg 36 fluid path. The up leg 36 is in contact with thethermal shield tank 28 but the down leg 34 is not in contact with tank 28. In this preferred embodiment, neon in liquid and gaseous form is used as the heat transport medium in thermal siphon 30. A liquid neon level 37 is maintained in the ballast tank 32 above the point 33 where the up leg 36 joins the ballast tank 32. In operation, liquid neon flows out the bottom of the ballast tank 32, down down leg 34 and up up leg 36, back into the ballast tank 32. Neon receives significant heat in the up leg 36 and much less heat in the down leg 34. The density difference of the neon in the two legs causes the neon to circulate in the manner described. In the preferred embodiment, there are two thermal siphons 30 sharing one ballast tank 32 as shown in FIG. 1. One of the thermal siphons has its up leg on one side of the shield tank 28 and the other thermal siphon has its up leg on the other side. The thermal shield tank and the up leg are aluminum with good thermal conductivity.

Figure 3A:
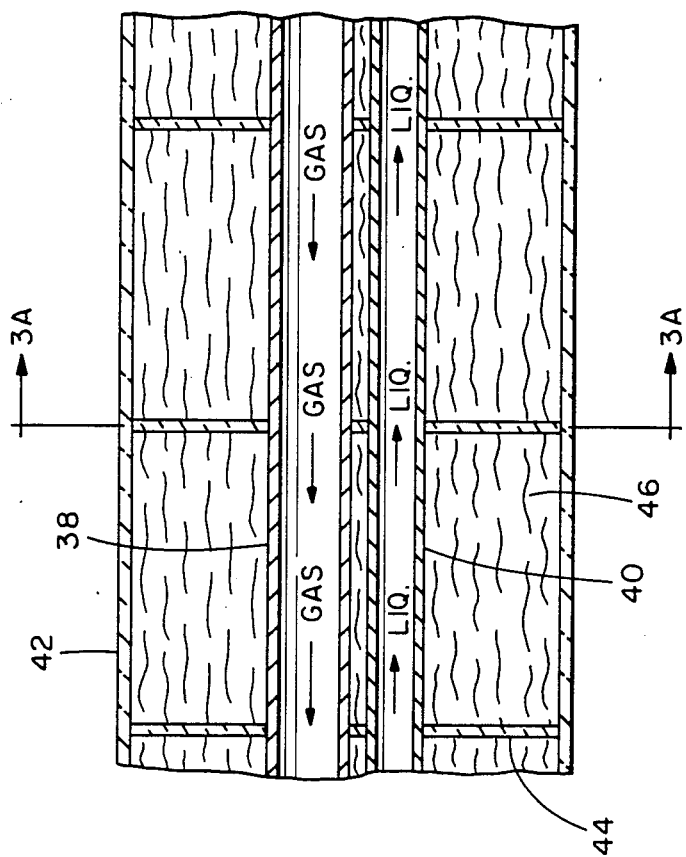
FIG. 3A is a detailed transverse cross-sectional view of the gas and liquid lines of one embodiment of the invention.

Neon gas exits the ballast tank 32 through a gas line 38 and flows to a mechanical cryocooler 48 disposed remotely from the magnet assembly 1. The gas is condensed in the cyrocooler 48 and liquid neon flows back to the ballast tank 32 through a liquid line 40. Sections of the gas line 38 and the liquid line 40 are shown in detail in an FIG. 3. Both lines are enclosed in insulated tube 42. In this preferred embodiment, the liquid line 40 is ¼-inch diameter tube; the gas line 38 is a ⅜-inch diameter tube and insulated tube 42 is a 2-inch diameter tube. The lines 38 and 40 are supported by insulating support brackets 44. The tube 42 also contains MLI insulation 46 and is evacuated to reduce heat transfer into the lines 38 and 40. Liquid neon flows by gravity from the cyrocooler 48 to the ballast tank 32. Neon pressure is maintained at about 1½ to 2 atmospheres. A preferred method of maintaining the pressure is to include an electric heating element 31 in the ballast tanks 32 which is energized when the pressure drops below a preset value. The system is filled through a fill line 50.

The cryocooler 48 can be any closed cycle refrigerator capable of liquifying neon at about 25 degrees Kelvin. Cryomech Model AL05 cryogenic refrigerator is used in our preferred embodiment.

While the invention has been explained with reference to certain exemplary embodiments, it should be understood that the invention is not to be limited by the description but is defined by the appended claims.

What is claimed is:

1. A cryogenic superconducting magnet system for use in magnetic resonance imaging (MRI) devices, said system comprising:

an evacuated container, a first tank mounted within said evacuated container and thermally insulated therefrom, boiling liquid helium disposed in said first tank and exhausted to the outside of said container, a cryogenic superconducting magnet disposed in said first tank, a metallic heat radiation shield disposed in said evacuated container and substantially surrounding said first tank, said shield being thermally insulated from both said container and said first tank, and a neon refrigeration system external to said shield for cooling said shield, said neon refrigeration system including neon refrigerant, a second tank for containing said neon refrigerant in its liquid state, at least one thermal siphon for circulating said neon refrigerant by convection from said second tank to said shield, the boiling of said neon refrigerant at said shield acting to circulate said neon refrigerant in said thermal siphon and cool said shield, a mechanical cryocooler remote from said container for condensing said neon refrigerant from the gaseous to the liquid state, and thermally insulated transfer means for transferring said neon refrigerant in its gaseous state from said second tank to said cryocooler and said neon refrigerant in its liquid state from said cryocooler to said second tank.

2. A system according to claim 1 wherein said second tank is disposed within said container.

* * * * *

UNITED STATES PATENT AND TRADEMARK OFFICE
CERTIFICATE OF CORRECTION

PATENT NO. : 4,680,936
DATED : July 21, 1987
INVENTOR(S) : Raymond E. Sarwinski, et al.

It is certified that error appears in the above-identified patent and that said Letters Patent is hereby corrected as shown below:

In the Abstract:

Line 10, change "liquified" to --liquefied--.

Figure 3B:
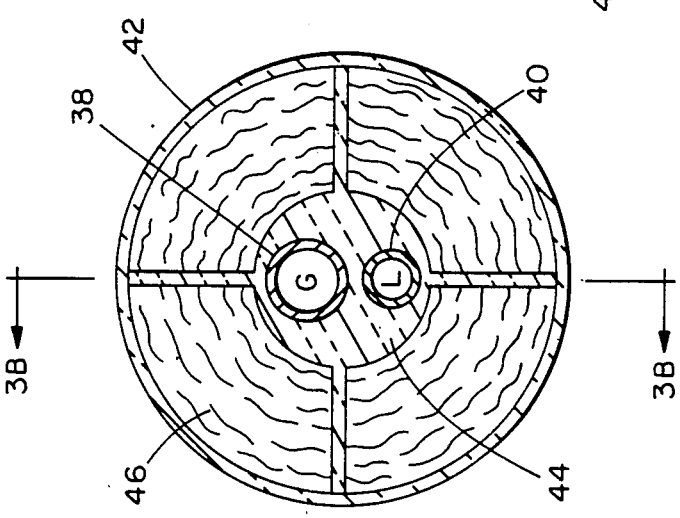
FIG. 3B is a detailed cross-sectional view of the gas and liquid lines shown in FIG. 3A, taken along line 3B—3B of FIG. 3A.

In the Specification:

Column 1, line 35, after "invention" insert --, taken along line 3A-3A of FIG. 3B--.

Column 2, line 3, change "cylindrical" to --annular--.

Column 2, line 4, change "liquid" to --liquefied--.

Column 2, line 9, delete "reduces".

Column 2, line 10, delete "in" after "resistance".

Column 2, line 33, change "thethermal" to --the thermal--.

Column 2, line 54, change "cyrocooler" to --cryocooler--.

Column 2, line 57, delete "an" after "in", first occurrence.

Column 2, line 57, insert "an" after "in", second occurrence.

Column 2, line 62, delete "brackets".

UNITED STATES PATENT AND TRADEMARK OFFICE
CERTIFICATE OF CORRECTION

PATENT NO. : 4,680,936

DATED : July 21, 1987

INVENTOR(S) : Raymond E. Sarwinski, et al.

It is certified that error appears in the above-identified patent and that said Letters Patent is hereby corrected as shown below:

Column 2, line 64, change "cyro-" to -- cryo- --.

Column 3, line 4, change "liquifying" to --liquefying--.

Signed and Sealed this

Fifteenth Day of December, 1987

Attest:

DONALD J. QUIGG

Attesting Officer

Commissioner of Patents and Trademarks